(12) United States Patent
Tinaphong et al.

(10) Patent No.: US 6,429,828 B1
(45) Date of Patent: Aug. 6, 2002

(54) VHF/UHF SELF-TUNING PLANAR ANTENNA SYSTEM

(75) Inventors: Prapan Paul Tinaphong, Marlton; Yi Lisa Shui, Cherry Hill, both of NJ (US)

(73) Assignee: Thomson Licensing S.A., Boulogne Cedex (FR)

(*) Notice: Subject to any disclaimer, the term of this patent is extended or adjusted under 35 U.S.C. 154(b) by 0 days.

(21) Appl. No.: 09/555,854

(22) PCT Filed: Dec. 4, 1998

(86) PCT No.: PCT/US98/25752

§ 371 (c)(1),
(2), (4) Date: Sep. 1, 2000

(87) PCT Pub. No.: WO99/30385

PCT Pub. Date: Jun. 17, 1999

Related U.S. Application Data

(60) Provisional application No. 60/067,620, filed on Dec. 5, 1997, and provisional application No. 60/100,743, filed on Sep. 17, 1998.

(51) Int. Cl.$^7$ .................................................. H01Q 1/38
(52) U.S. Cl. ...................... 343/824; 343/751; 343/846; 343/861; 343/795
(58) Field of Search .................... 343/749, 751, 343/795, 702, 826, 846, 850, 860, 861, 824, 700 MS; H01Q 1/38

(56) References Cited

U.S. PATENT DOCUMENTS

| 3,710,337 A | 1/1973 | Grant | 343/701 |
|---|---|---|---|
| 3,887,925 A | * 6/1975 | Ranghelli et al. | 343/795 |
| 4,758,843 A | * 7/1988 | Agrawal et al. | 343/795 |
| 4,860,019 A | 8/1989 | Jiang et al. | 343/795 |
| 5,828,346 A | * 10/1998 | Park | 343/826 |

FOREIGN PATENT DOCUMENTS

| EP | 274592 | 7/1988 | H01Q/1/08 |
|---|---|---|---|
| EP | 349499 | 1/1990 | H01Q/1/40 |
| EP | 630106 | 12/1994 | H03G/3/20 |
| WO | 88/09065 | 11/1988 | H01Q/9/28 |

OTHER PUBLICATIONS

Akimoto M Et Al: "Characteristics of Bidirectional Printed Dipole Antenna for Street–Microcellular Systems" 1996 IEEE 46$^{th}$ Vehicular Technology Conference, Mobile Technology for the Human Race Atlanta, Apr. 28—May 1, 1996, vol. 1, No. Conf. 46, Apr. 28, 1996, pp. 357–361, See p. 357—p. 358; Figures 1,4.

European Search Report Dated Mar. 5, 1999.

* cited by examiner

*Primary Examiner*—Michael C. Wimer
(74) *Attorney, Agent, or Firm*—Joseph S. Tripoli; Joseph J. Laks; William A. Lagoni

(57) ABSTRACT

A wide-band self-tuning antenna system for the reception of VHF/UHF signals includes planar antenna elements located on both the surfaces of a printed circuit board and a tuner unit which includes a plurality of matching networks for the respective plurality of bands of frequencies. The planar elements on the respective surfaces of the printed circuit board are substantially identical in shape.

8 Claims, 10 Drawing Sheets

VHF/UHF SELF-TUNING PLANAR ANTENNA SYSTEM

This application claims priority from provisional applications Nos. 60/067,620, filed Dec. 5, 1997 and No. 60/100,743, filed Sep. 17, 1998.

FIELD OF THE INVENTION

The present invention concerns antenna systems for receiving broadcast signals such as television signals.

BACKGROUND INFORMATION

Conventional indoor TV antenna systems generally include two separate antennas for respective VHF and UHF reception. The antenna for receiving the VHF bands employs a pair of telescopic elements forming a dipole with each of the elements having a maximum length of from 4 to 6 feet (1.5 to 2.5 m). The two elements usually are mounted to permit the elements to be spread apart to increase or shorten the dipole length and those elements are commonly referred to as "rabbit ears." The indoor UHF antenna typically is a loop having a diameter of about 7½ inches (20 cm).

One problem associated with the conventional indoor antenna systems is that the physical dimension of the VHF dipole is undesirably long for the ordinary setting in a living room and that the length as well as the direction of the dipole elements may need to be adjusted depending upon the receiving channels. The second problem is that the performance of such conventional indoor VHF/UHF antennas changes in response to changes of the physical conditions around the antenna elements. For example, it is difficult for a user to make proper adjustment of the antennas since a human body coming into contact with an antenna changes the electro-magnetic conditions associated with the antenna elements. The third problem is that the conventional indoor antenna systems do not always provide a sufficient signal level for good reception.

A need exists for an antenna system including compact-size antennas which are capable of receiving a sufficient level of signals throughout the entire VHF/UHF broadcast bands of frequencies without any physical adjustments. Further, there is need for such an antenna system that can be used in either indoor or outdoor applications.

SUMMARY

In accordance with the present invention, an antenna system for receiving VHF/UHF broadcast signals comprises a planar antenna and a tuner unit which includes a tuning arrangement. A gain controllable amplifier may be included in the tuner unit where necessary. The planar antenna includes a pair of antenna elements which are substantially identical in shape. These elements are located on the respective surfaces of a dielectric board. The tuning arrangement includes a plurality of matching networks for the respective plurality of bands of broadcast frequencies.

BRIEF DESCRIPTION OF THE DRAWINGS

In the drawings.

In the various figures, the same or similar elements shown are identified by the same reference numbers.

DESCRIPTION OF THE PREFERRED EMBODIMENT

In this application, the term "television apparatus" is used to describe any television apparatus which includes at least one television tuner (such as television receivers, VCR's, etc.).

Figure 1:
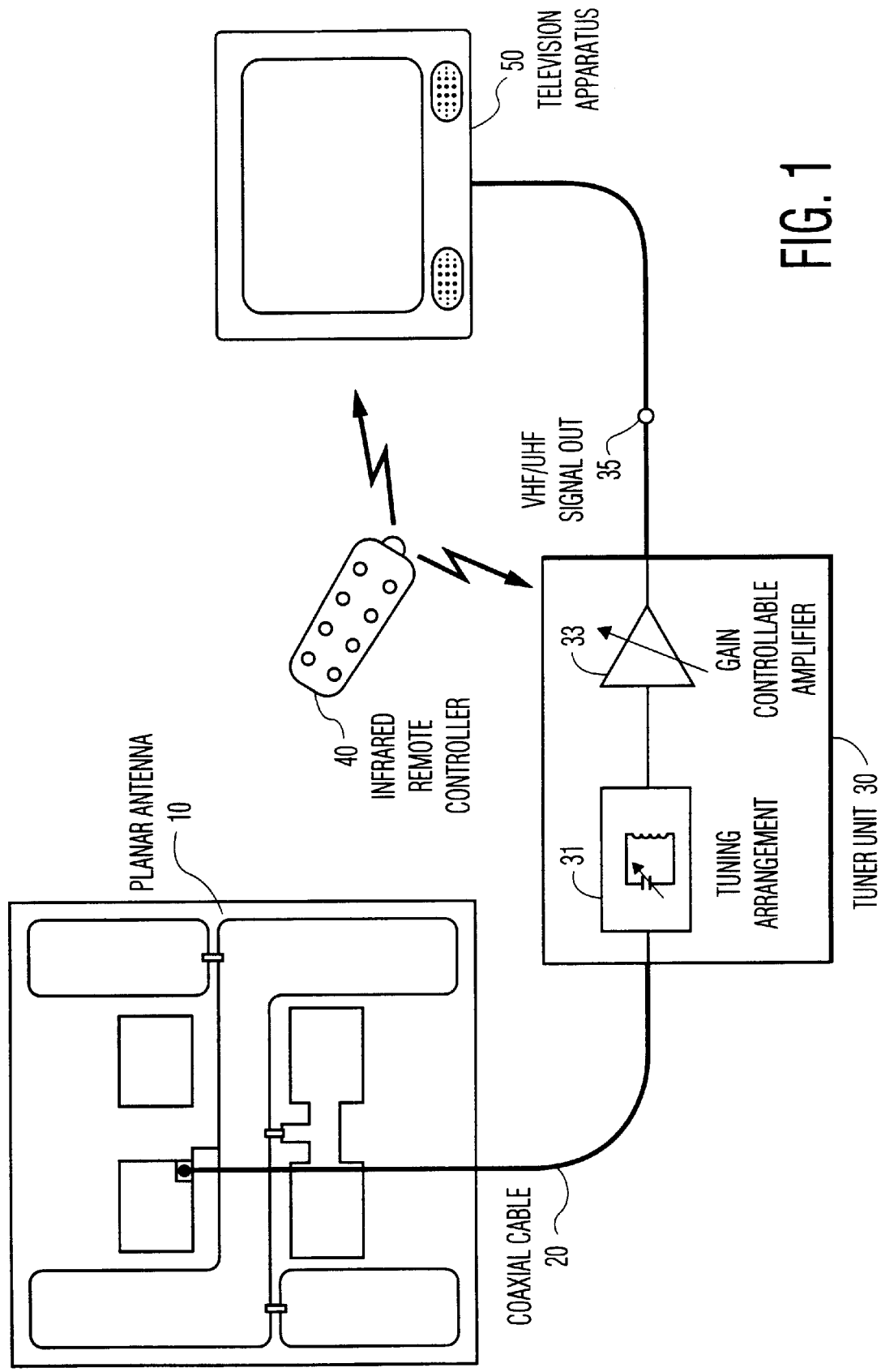
FIG. 1 illustrates an embodiment of the aspects of the disclosed planar antenna system which includes a planar antenna and a tuner unit including a tuning arrangement and a gain controllable amplifier.

FIG. 1 illustrates a VHF/UHF planar antenna system embodying the aspects of the present invention. The planar antenna system includes planar antenna 10 and tuning unit 30. Planar antenna 10 and tuning unit 30 are coupled by a coaxial cable 20. As to this exemplary embodiment, the characteristic impedance of coaxial cable 20 is 75Ω.

Tuner unit 30 includes tuning arrangement 31 and gain controllable amplifier 33. Gain controllable amplifier 33 is optional and may not be included in tuner unit 30 where the television broadcast signals are sufficiently strong. Tuning arrangement 31 includes a plurality of impedance matching networks 610 (e.g., bandpass filters) for the respective plurality of bands of broadcast frequencies (see FIG. 8 for detail). Common infrared (IR) remote controller 40 is used to select both the matching networks in tuning unit 30 and the channels for television apparatus 50 simultaneously. Of course, a separate IR remote controller can be utilized to select a proper matching network individually. The gain of amplifier 33 is controlled automatically by a built-in automatic gain control (AGC) arrangement (see FIGS. 8–10 for the schematics).

Figure 2:
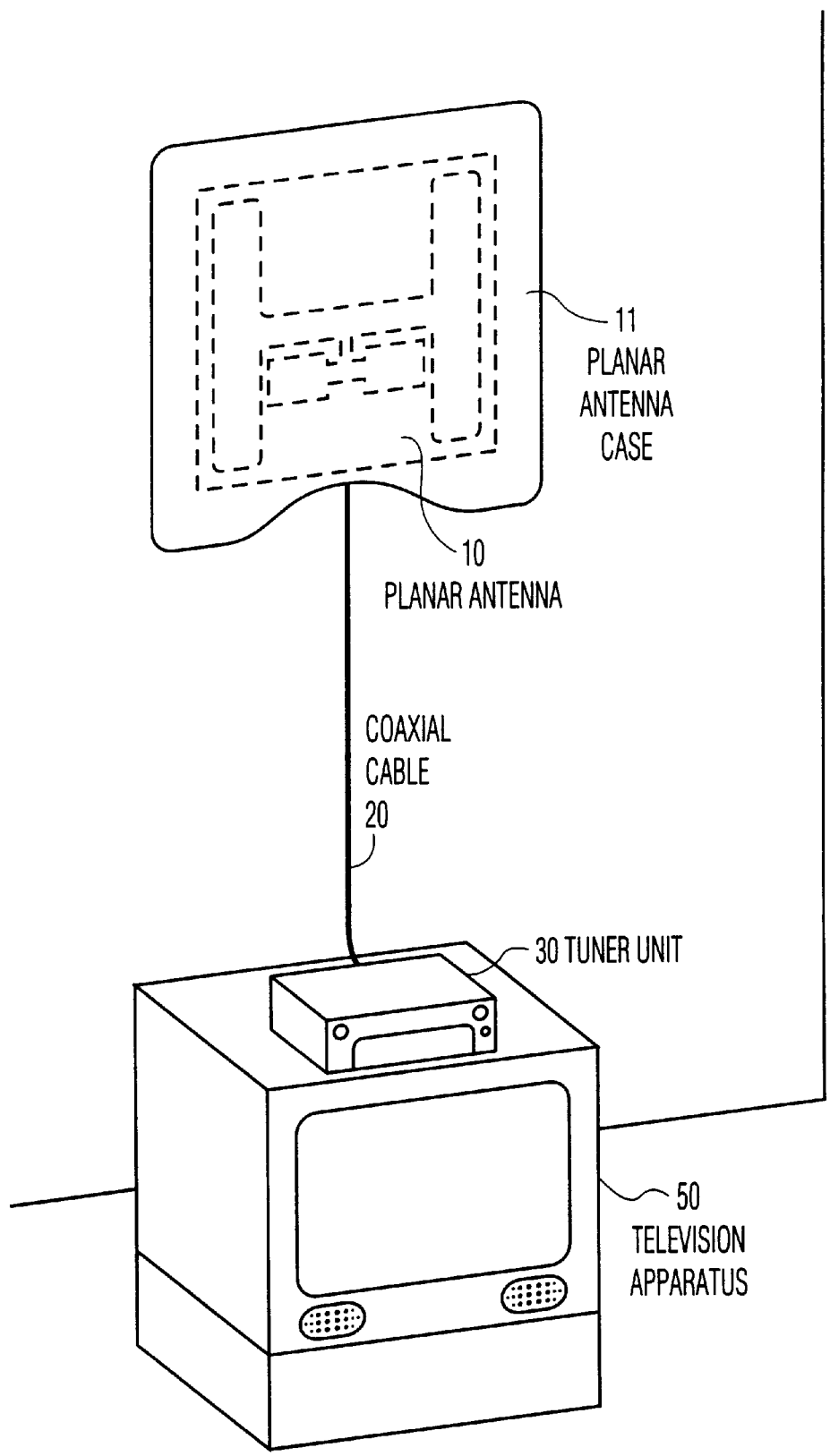
FIG. 2 illustrates an exemplary application for the use of the planar antenna system.

FIG. 2 illustrates one of the applications for indoor use of the planar antenna system. Here planar antenna 10 is located inside of planar antenna case 11 which is made of dielectric materials. Antenna case 11, including planar antenna 10, hangs on the wall while tuner unit 30 is placed on the top of television apparatus 50. Coaxial cable 20 is used to couple between planar antenna 10 and tuner unit 30. Antenna case 11 can be designed to be waterproof for outdoor uses.

Figure 3:
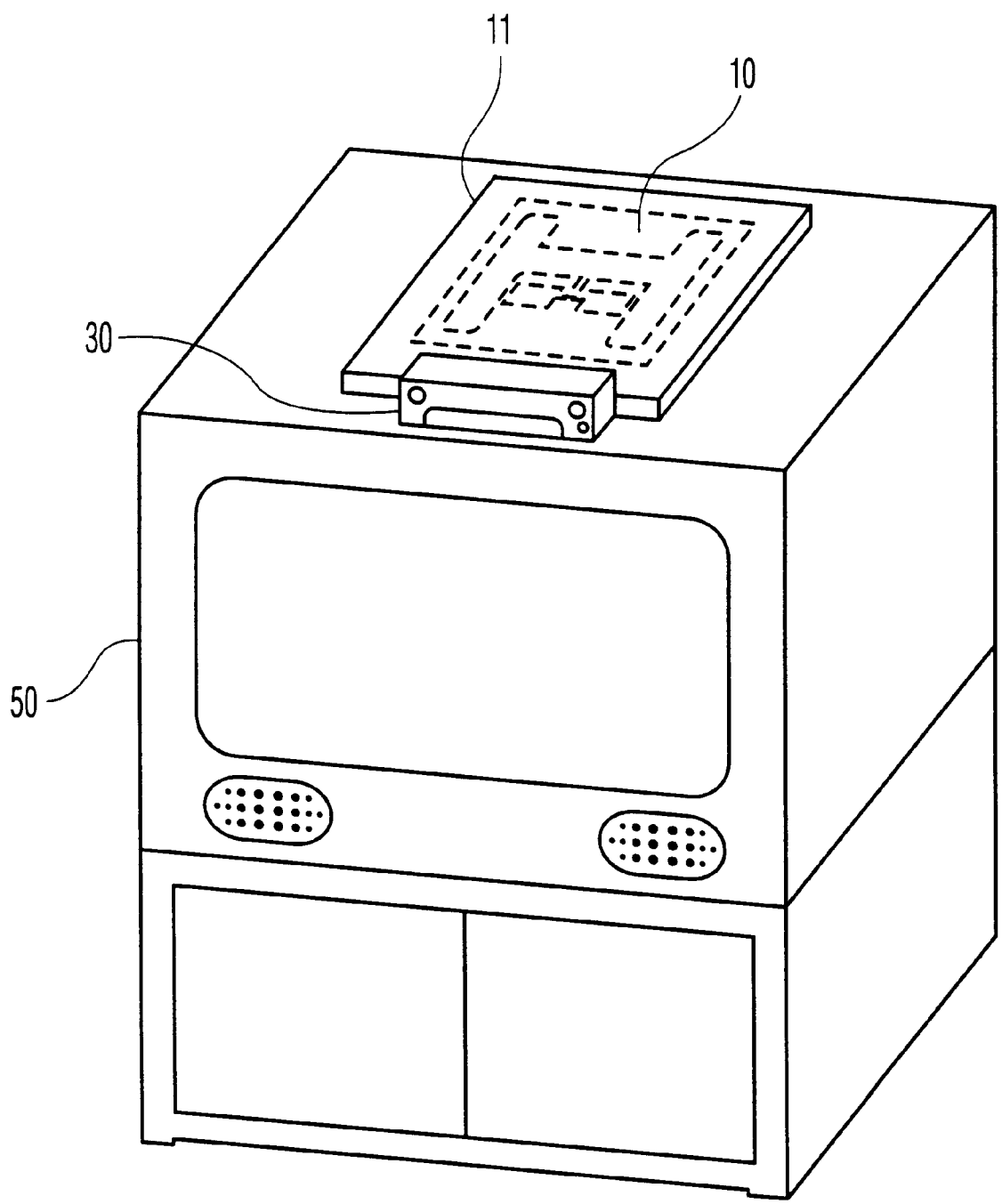
FIG. 3 illustrates another exemplary application for the use of the planar antenna system.

FIG. 3 illustrates another application for the use of the planar antenna system. Here tuner unit 30 is located underneath antenna case 11 which is placed on the top of television apparatus 50.

Figure 4:
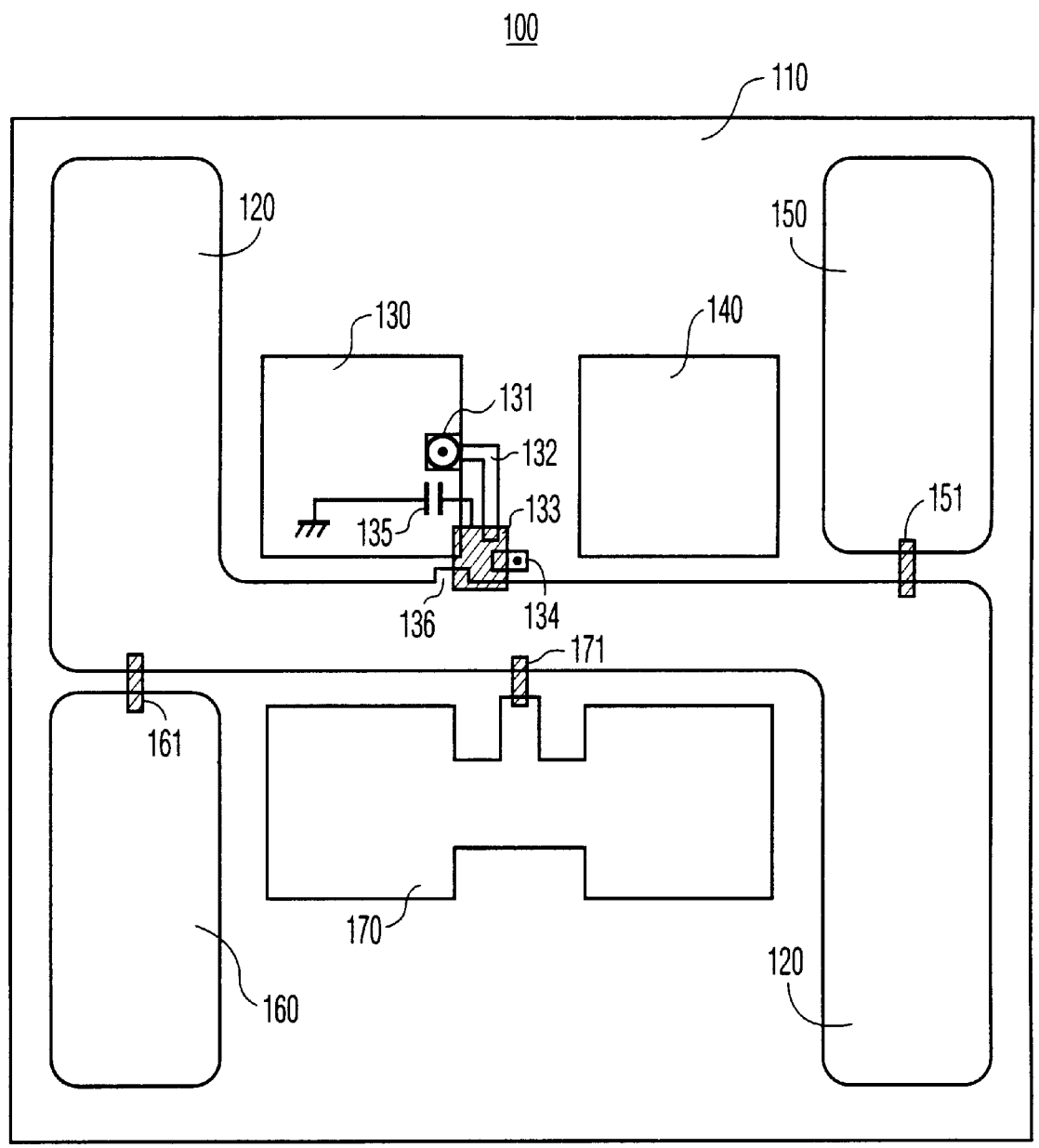
FIG. 4 illustrates a top view of an embodiment of the planar antenna.
Figure 5:
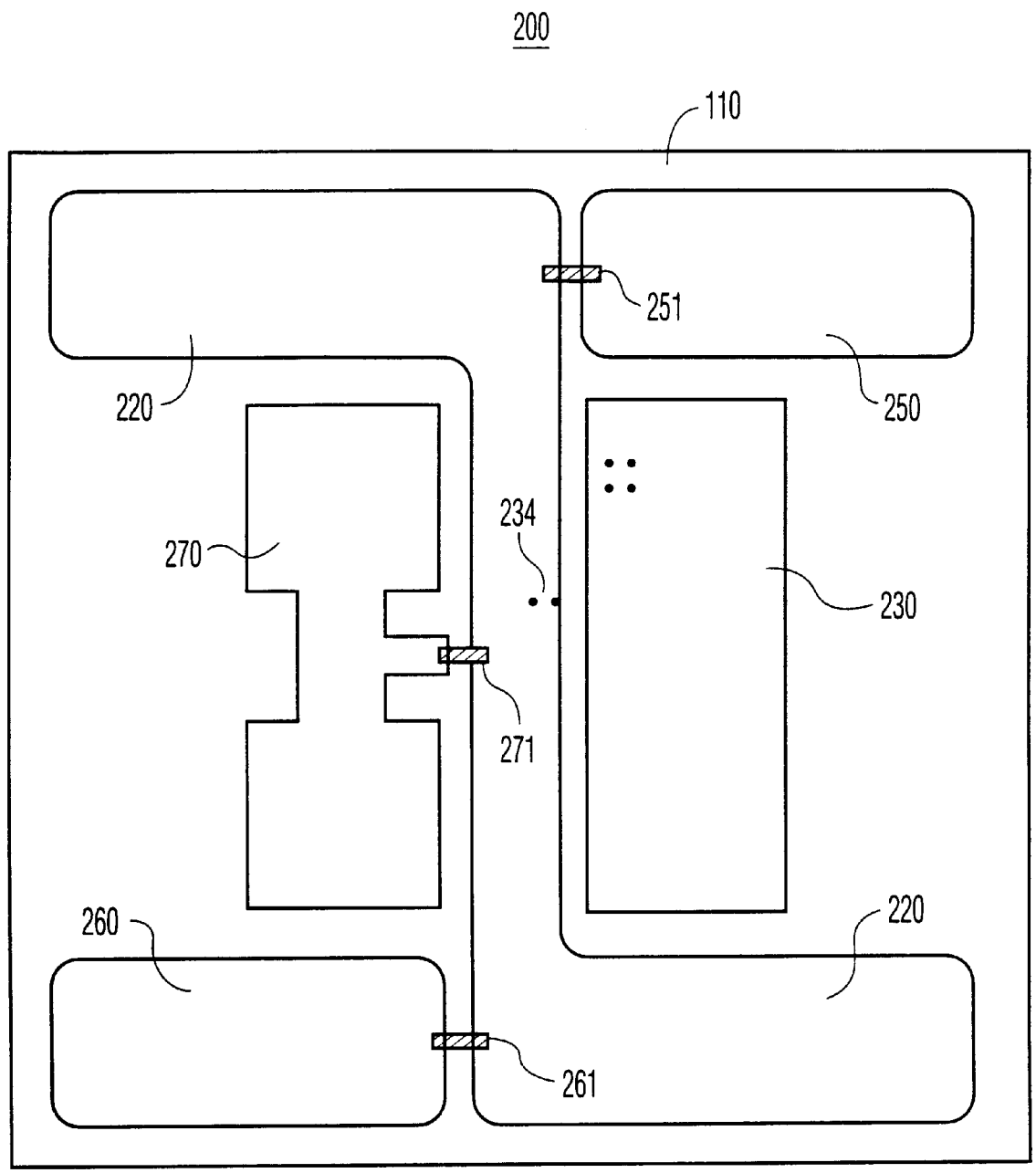
FIG. 5 illustrates a bottom view of the embodiment of the planar antenna shown in FIG. 4.
Figure 6:
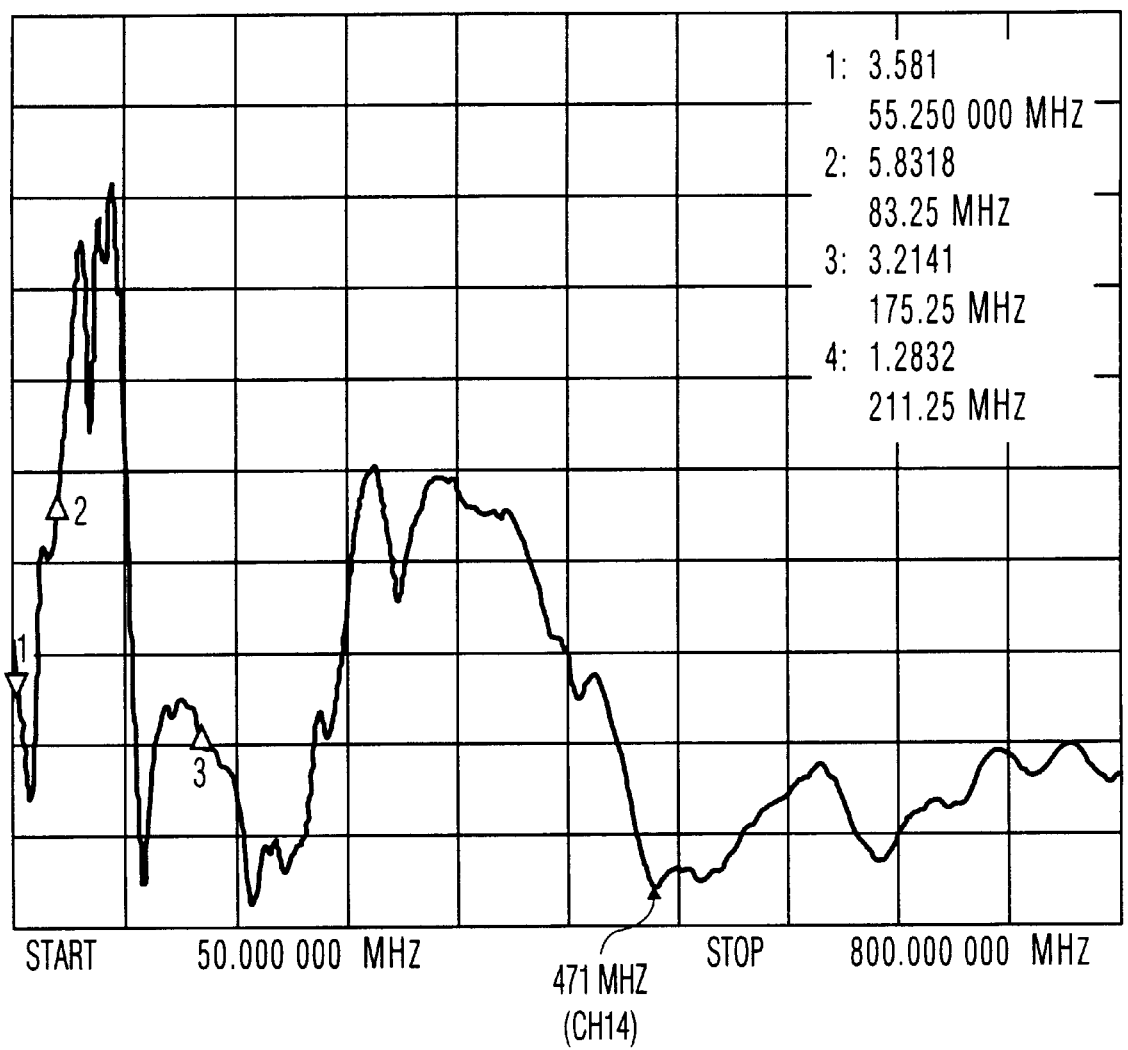
FIG. 6 illustrates VSWR characteristics (50–800 MHz) of the embodiment of the planar antenna.
Figure 7:
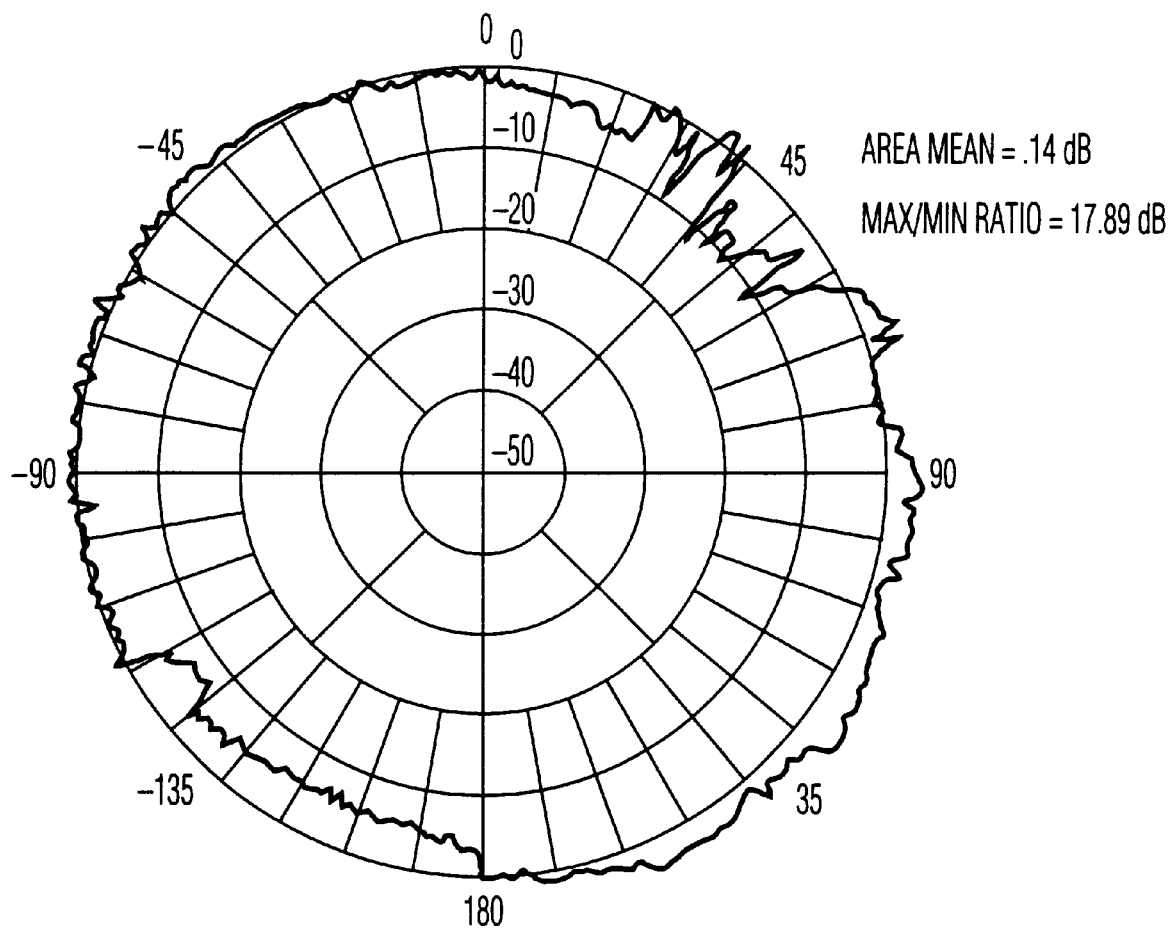
FIG. 7 illustrates a radiation pattern of the embodiment of the planar antenna at one of the low-band VHF television channel frequencies (67.25 MHz)

FIGS. 4 and 5 illustrate respective top and bottom views 100, 200 of planar antenna 10. The antenna elements of planar antenna 10 are different from those of the traditional dipole (rabbit ears) or loop antennas in many aspects. In particular, the elements are developed based upon microstrip techniques, and the unique patterns of the elements make it possible for the planar antenna system to provide omini-directional reception of the television signals as can be seen from the radiation pattern characteristic of the antenna that is shown in FIG. 7. Thus, no adjustment for the direction of the antenna is necessary once installed. This ominidirectional feature in the horizontal platform is believed to result from the fact that the majority of RF current flows along the edges of every one of the planar antenna elements.

As to the exemplary embodiment shown in FIGS. 4 and 5, the antenna elements are etched directly on a printed circuit board (PCB), such as the model "MC3D" Medium Frequency Laminate, manufactured by Glasteel Industrial Laminates (0.062" thickness, double-side PCB board with dielectric constant of 3.53+/−0.08). The dimension of the PCB is approximately 12 by 12 inches (30×30 cm). Both VHF and UHF antenna elements are formed on each side of the PCB, and VHF and UHF elements on one side are substantially identical, in shape, to respective VHF and UHF elements on the other side of the PCB. In addition, the former are rotated 90 degrees with respect to the latter.

The VHF antenna elements feature a unique "H"-shape configuration. The antenna element on each end of the "H" shape is approximately 2.5 inches (6.5 cm) width×12 inches (30 cm) long. Both ends of the "H" shape are connected together with approximately 1 inch (2.5 cm) width by 7 inches (17.5 cm) long of microstrip transmission line to complete the "H" shape. As described above, the two "H"-shape VHF elements on the respective sides of the PCB are substantially identical in shape, and the VHF element on the top side rotates 90 degrees from that on the bottom side of the PCB.

Each one of the "H"-shape elements for VHF signals is formed as a combination of the following three separate regions (Reference numbers for the respective corresponding regions on the bottom side are shown in the parenthesis): ① "S"-shape main region 120 (220); ② first supplemental region 150 (250); and ③ a second supplemental region 160 (260). First supplemental region 150 (250) is approximately 2.5 inches (6.5 cm) width by 5.4 inches (13.7 cm) length and separated from main region 120 (220) by a gap of approximately one-tenth inch (2.5 mm). First supplemental region 150 (250) is electrically coupled to main region 120 (220) through inductor 151 (251), for example, 100 $\mu$H high Q surface-mounted chip inductor. It has been found that this arrangement extends the effective electrical length of main region 120 (220).

Second supplemental region 160 (260) is substantially identical to first supplemental region 150 (250) in dimensions. Second supplemental region 160 (260) is coupled to main region 120 (220) through capacitor 161 (261), for example, 15 pF surface-mounted chip capacitor. It has been found that second supplemental region 160 (260) coupled via capacitors 161 (251) significantly improves the overall voltage standing wave ratio (VSWR) characteristics of the planar antenna for the lower VHF television band of frequencies (50–88 MHz).

There is a reflector region 140 only on the top side of the PCB. Reflector region 140 functions as a reflector for first supplemental region 150. It has been found that reflector region 140 improves the overall performance of the planar antenna in the upper VHF television band of frequencies (174–216 MHz).

UHF antenna elements 170, 270 feature an "H"-shape configuration as well and formed on the respective sides of the PCB. As described above, these two UHF elements are also substantially identical in shape, and one rotates 90 degrees from the other.

Each end of the "H" shape element is square in shape and is approximately 2.5 inches (6.5 cm) width by 2.5 inches (6.5 cm) length. The two ends are connected together with approximately 1 inch (2.5 cm) width by 1.5 inches (3.8 cm) length microstrip transmission line to form the "H"-shape configuration. UHF element 170 (270) is coupled to the approximately middle point of the microstrip transmission line of the VHF element 120 (220) through inductor 171 (271), e.g., 100 $\mu$H high Q surface-mounted chip inductor.

The top side of the PCB also include a ground plane region 130. Ground plane region 130 is square in shape and is approximately 2.5 by 2.5 inches (6.5×6.5 cm). Female "F" connector 131 is located on ground plane region 130. The feet (ground line) of connector 131 is connected to both ground plane region 130 and, by piercing through the PCB, another ground plane region 230 on the bottom side of the PCB. The dimension of ground plane region 230 is approximately 2.5 inches (6.5 cm) width by 6.5 inches (16.5 cm) length. The signal line of connector 131 is connected to signal transmission line 132 formed on the top side of the PCB. It has been found that both of ground plane regions 130, 230 contribute to the stabilization of the overall performance of the planar antenna system notwithstanding the changes of the physical conditions around the planar antenna.

As shown in FIG. 4, a 4:1 balun transformer 133 is located on the top side of the PCB for impedance matching between the planar antenna elements and coaxial cable 20. Ends of the first winding of transformer 133 are coupled to respective ones of connecting point 136 and connecting region 134. Connecting point 136 is located approximately at the middle of the transmission line of VHF elements 120. Connecting region 134 is connected to connecting point 234 of VHF element 220 on the bottom side via two throughholes. Ends of the second winding are coupled to respective transmission line 132 and ground plane 130. Matching capacitor 135 (4 pF) is coupled between the center of the second winding and ground plane 130 for better impedance matching. Alternatively, a variable capacitor (2–6 pF) may be coupled between the two ends of the second winding as shown in FIG. 8.

Another characteristics of the planar antenna is that unlike conventional microstrip antennas, there is no flat ground plane region on the bottom side of the PCB, which entirely covers the region beneath the antenna elements formed on top side of the PCB. As to conventional microstrip antennas, the bandwidth of such antennas is proportional to the distance between the antenna elements on one surface and flat ground plane region on the other side of the substrate used (i.e., the thickness of the substrate). It has been found that the elimination of this type of flat ground plane region contributes to the wide-band characteristic of the planar antenna. As a reference, see Munson, Robert E., "Microstrip Antennas" in *Antenna Enaineerina Handbook* (3rd ed.) (McGraw Hill, 1993).

Figure 8:
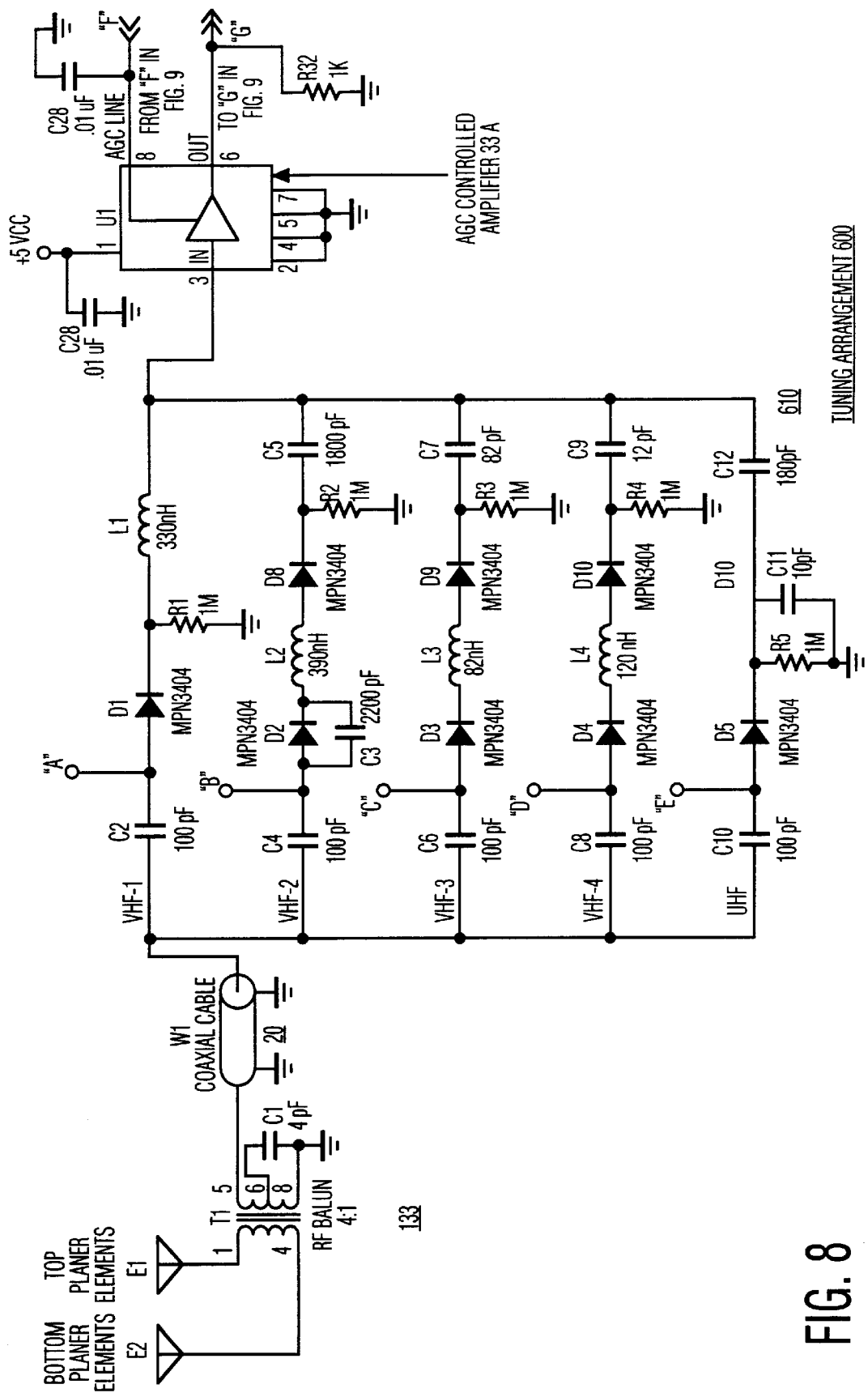
FIGS. 8–10 are schematic diagrams of an embodiment of the aspects of the described tuner unit which includes a plurality of selectable matching networks and a gain controllable amplifier controlled by a built-in AGC arrangement.

FIG. 8 shows the schematic diagram of a portion of tuner unit 30 which includes a plurality of matching networks. As to this particular exemplary embodiment, five bandpass filters 610 (BPF's) are utilized as matching networks, and they are pre-tuned to respective ones of five different bands of broadcast frequencies. They are the following:

VHF 1: 54–72 MHz (Channels 2 to 4 in the U.S.)
VHF 2: 76–88 MHz (Channels 5 to 6 in the U.S.)
VHF 3: 174–192 MHz (Channels 7 to 9 in the U.S.)
VHF 4: 192–216 MHz (Channels 10 to 13 in the U.S.)
UHF: 470–800 MHz (UHF Channels in the U.S.)

Figure 9:
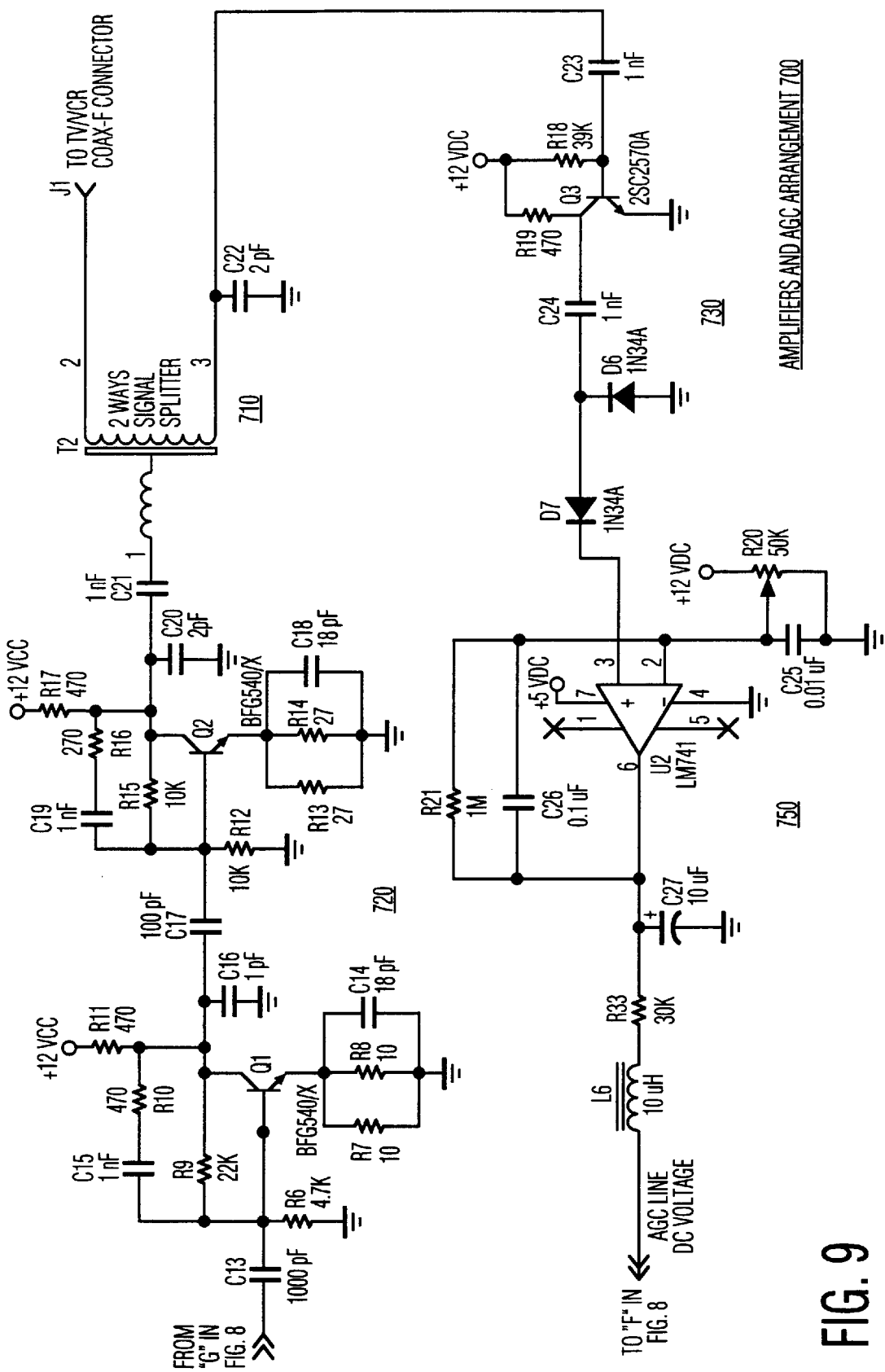
Figure 10:
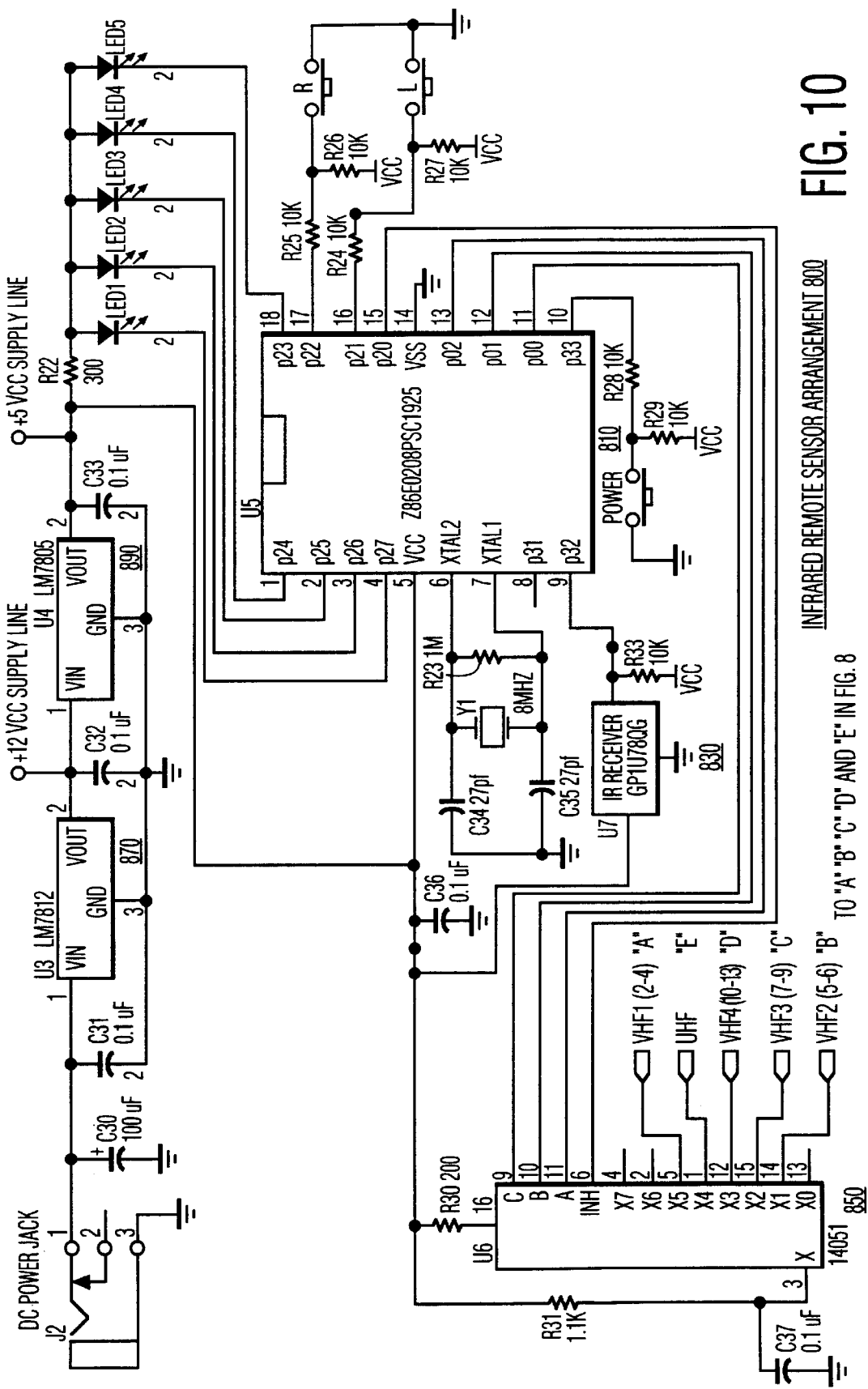

As shown in FIGS. 8–10, the band selection is to be made in accordance with receiving channels. A user selects a proper band by using an IR remote controller. However, this selection can be done automatically in response to the level of the automatic gain control (AGC) signal for gain controllable amplifier 33a. The AGC signal works to reduce the gain of amplifier 33a when a proper matching network is selected for a receiving channel.

By virtue of the AGC arrangement, the level of the output signal of tuning unit 30 is maintained at a desirable predetermined level, regardless of the variation of the strength of the received television signals throughout an entire band of frequencies.

In the exemplary embodiment shown in FIGS. 8 and 9, the AGC arrangement includes gain controllable amplifier 33a; signal amplifier stage 720; signal splitter 710; DC rectifier 730; and DC offset voltage compensation circuitry 750. It has been found that a combination of a plurality of selectable front-end band pass filters 610 and the subsequent AGC arrangement makes AGC operate properly throughout the entire VHF/UHF television bands of frequencies (50–800 MHz).

For faster adjustment of amplifier 33a, a microprocessor ay be utilized to control the gain of amplifier 33a together with a memory which stores information on the desirable AGC levels for respective broadcast channels.

In addition, tuning unit 30 may further include an RF signal selection switch which allows a user to select between RF signals from the planar antenna and those from other signal sources (e.g., a satellite dish, cable, VCR, etc.).

In FIG. 10, Infrared remote sensor arrangement 800 includes IR signal receiver 830, microprocessor 810, multiplexer 850, five light emitting diodes (LED's) and two manually controlled switches R, L.

LED1, LED2, LED3, LED4 and LED5 indicate the selections of respective ones of five different bands of broadcast frequencies, namely VHF-1, VHF-2, VHF-3, VHF-4 and UHF in FIG. 8. That is, the five LED's indicate the selections of respective ones of five different BPF's 610. For example, LED 1 turns on when the BPF for VHF-1 is selected. Manual switches R, L function as "tup-down" switches for the band selection so that a user without a remote controller may still select proper bands of frequencies.

IR receiver 830 coupled to microprocessor 810 receives IR signals from the remote controller. Then microprocessor 810 generates control signals.

In response to the control signals, multiplexer 850 coupled to microprocessor 810 sends band selection signals A. B. C. D. E to respective ones of PIN diodes D1, D2, D3, D4 and D5. Here, multiplexer 850 functions as a plurality of digitally-controlled analog switches. Power supply arrangement 840 includes two voltage regulators 870, 890.

While the invention has been described with reference to a preferred embodiment, it is understood that the words which have been used herein are words of description, rather than words of limitation. Numerous alterations of, or modification to, the antenna system of the present invention may occur to one skilled in the art without departure from the spirit and scope of the invention and the principles and features thereof. For example, the planar antenna system can be used not only for receiving digital and/or analog television signals but also for receiving digital and/or analog audio or data signals.

What is claimed is:

1. A planar antenna for receiving VHF/UHF signals comprising:

a dielectric substrate having first and second surfaces on which first and second conductive patterns are located respectively;

each of said first and second conductive patterns including elements forming respective first and second H-shaped patterns;

said first and second H-shaped patterns forming first and second antenna elements respectively;

said first and second antenna elements being substantially identical in shape; and said first antenna element being rotated substantially 90 degrees with respect to the second antenna element.

2. The planar antenna of claim 1, wherein:

each of said first and second conductive patterns form a respective plurality of antenna elements.

3. The planar antenna of claim 1, wherein:

each of said first and second conductive patterns further form respective ground plane regions.

4. The planar antenna of claim 1, wherein:

the antenna elements being formed on the first and second surfaces in respective first and second patterns for providing a substantially omnidirectional reception of a television signal.

5. The planar antenna of claim 1, further comprising:

an amplifier for amplifying signals received by said antenna elements;

control means for controlling the gain of said amplifier in response to the level of said received signals; and a plurality of matching networks for providing impedance matching between said antenna elements and said amplifier within the respective plurality of bands of frequencies.

6. The planar antenna of claim 2, further comprising:

an amplifier for amplifying signals received by said antenna elements;

control means for controlling the gain of said amplifier in response to the level of said received signals; and a plurality of matching networks for providing impedance matching between said antenna elements and said amplifier within the respective plurality of bands of frequencies.

7. The planar antenna of claim 3, further comprising:

an amplifier for amplifying signals received by said antenna elements;

control means for controlling the gain of said amplifier in response to the level of said received signals; and a plurality of matching networks for providing impedance matching between said antenna elements and said amplifier within the respective plurality of bands of frequencies.

8. The planar antenna of claim 4, further comprising:

an amplifier for amplifying signals received by said antenna elements;

control means for controlling the gain of said amplifier in response to the level of said received signals; and a plurality of matching networks for providing impedance matching between said antenna elements and said amplifier within the respective plurality of bands of frequencies.

* * * * *